United States Patent
Kanno et al.

(10) Patent No.: US 11,935,338 B2
(45) Date of Patent: Mar. 19, 2024

(54) AUTOMOTIVE ELECTRONIC CONTROL UNIT

(71) Applicant: Hitachi Automotive Systems, Ltd., Hitachinaka (JP)

(72) Inventors: Hiroshi Kanno, Hitachinaka (JP); Hiroshi Usami, Hitachinaka (JP); Masataka Ota, Hitachinaka (JP)

(73) Assignee: Hitachi Astemo, Ltd., Hitachinaka (JP)

( * ) Notice: Subject to any disclaimer, the term of this patent is extended or adjusted under 35 U.S.C. 154(b) by 635 days.

(21) Appl. No.: 17/255,321

(22) PCT Filed: Jun. 24, 2019

(86) PCT No.: PCT/JP2019/024869
§ 371 (c)(1),
(2) Date: Dec. 22, 2020

(87) PCT Pub. No.: WO2020/012929
PCT Pub. Date: Jan. 16, 2020

(65) Prior Publication Data
US 2021/0272395 A1  Sep. 2, 2021

(30) Foreign Application Priority Data
Jul. 13, 2018 (JP) .................. 2018-132855

(51) Int. Cl.
*G07C 5/08* (2006.01)
*G01R 19/165* (2006.01)
*G01R 27/08* (2006.01)

(52) U.S. Cl.
CPC ..... *G07C 5/0808* (2013.01); *G01R 19/16571* (2013.01); *G01R 27/08* (2013.01); *G07C 5/0816* (2013.01)

(58) Field of Classification Search
CPC ............ G01R 31/005; G01R 19/16571; G01R 27/08; G07C 5/0816
See application file for complete search history.

(56) References Cited

U.S. PATENT DOCUMENTS

| | | | | |
|---|---|---|---|---|
| 7,779,669 | B2 * | 8/2010 | Fukagai | F02D 41/1456 73/23.31 |
| 2009/0095052 | A1 * | 4/2009 | Inoue | F02D 41/28 73/23.32 |
| 2009/0278548 | A1 | 11/2009 | Hashimoto et al. | |

FOREIGN PATENT DOCUMENTS

| | | |
|---|---|---|
| JP | 4-134063 U | 12/1992 |
| JP | 2001-108645 A | 4/2001 |

(Continued)

OTHER PUBLICATIONS

International Search Report (PCT/ISA/210) issued in PCT Application No. PCT/JP2019/024869 dated Oct. 8, 2019 with English translation (nine (9) pages).

(Continued)

*Primary Examiner* — Jeff A Burke
*Assistant Examiner* — Jerrod Irvin Davis
(74) *Attorney, Agent, or Firm* — Crowell & Moring LLP

(57) ABSTRACT

Generally, the current threshold value is set as a fixed value. Therefore, even in a case where an abnormality occurs in the load and the resistance value is small, when the power supply voltage applied to the load is low, the current value is also low, and falls below the threshold value, and there is a possibility that the overcurrent is not detected. In the present invention, by providing a second detection means that detects a load abnormality by calculating the resistance value of the load from information of the power supply voltage applied to the load, in addition to a first detection means that detects an overcurrent state that indicates the load abnormality using only current value information, it is (Continued)

possible to detect an overcurrent indicating an abnormality of the load even when the power supply voltage applied to the load is low.

5 Claims, 3 Drawing Sheets

(56) References Cited

FOREIGN PATENT DOCUMENTS

| | | |
|---|---|---|
| JP | 2009-74559 A | 4/2009 |
| JP | 2009-270932 A | 11/2009 |
| JP | 2009-278724 A | 11/2009 |
| JP | 2010-117131 A | 5/2010 |
| JP | 2016-208329 A | 12/2016 |

OTHER PUBLICATIONS

Japanese-language Written Opinion (PCT/ISA/237) issued in PCT Application No. PCT/JP2019/024869 dated Oct. 8, 2019 (six (6) pages).
Japanese-language Office Action issued in Japanese Application No. 2020-530074 dated Oct. 12, 2021 (four (4) pages).

* cited by examiner

AUTOMOTIVE ELECTRONIC CONTROL UNIT

TECHNICAL FIELD

The present invention relates to an in-vehicle electronic control device for the purpose of improving the accuracy of detecting an abnormality of a load driven by the in-vehicle electronic control device.

BACKGROUND ART

Vehicles include various sensors to control the engine. The information from these sensors is input to the in-vehicle electronic control device (ECU) and used to control the engine. For example, an O2 sensor detects the concentration of oxygen in the exhaust gas. The mixture ratio (air-fuel ratio) of fuel and air is controlled by this oxygen concentration information. If the O2 sensor does not operate properly, proper combustion will not occur, and the concentration of carbon monoxide and nitrogen oxides in the exhaust gas will increase, which may have a significant effect on the catalyst that purifies the exhaust gas. The ECU is required to detect an abnormality of the sensor at an early stage and urge the user to take measures such as repair.

The O2 sensor is activated by heating to an appropriate temperature to detect the oxygen concentration. Therefore, a heater is provided inside the sensor. However, in the case of a battery short where the battery voltage is applied to both ends of the heater, no current flows through the heater and the sensor cannot be heated. The ECU detects an overcurrent due to a battery short, makes notification of the occurrence of an abnormality, and performs processing such as stopping the drive of the heater.

In this way, detecting the abnormality such as load battery shorts is one of the major roles of ECUs.

When the resistance value drops due to deterioration of the external element, which is the load, or when the power supply contact (battery short circuit) occurs due to damage to the connection cable, an excessive current flows through the ECU. The ECU uses this as an overcurrent to detect load abnormalities.

The ECU detects the current value that drives the load, and detects it as an overcurrent when the current value exceeds the threshold value. Generally, this current threshold value is set as a fixed value.

PTL 1 discloses a technique of conventionally detecting only the current flowing through a load and detecting an overcurrent. The overcurrent is detected based on a fixed threshold value, and the overcurrent is detected as a current exceeding this threshold value.

CITATION LIST

Patent Literature

PTL 1: JP 2009-278724 A

SUMMARY OF INVENTION

Technical Problem

The current value flowing through the load is determined by the applied power supply voltage, the resistance value of the load, the resistance value of the connection cable, the resistance values of the wiring in the ECU and the drive element, and the like. However, in general, resistance values other than the resistance value of the load are designed to be sufficiently smaller than the resistance value of the load. The conditions in which the current value is lowered include a case where the power supply voltage applied to the load is low and a case where the resistance value of the load increases. Therefore, even in a case where an abnormality occurs in the load and the resistance value is small, when the power supply voltage applied to the load is low, the current value is also low, and falls below the threshold value, and there is a possibility that the overcurrent is not detected.

In vehicles, the power supply voltage is not fixed and may be low. As a result, the current value may be low. Even when the current value is abnormal as a load, it is not detected as an overcurrent when it falls below the threshold value, so that it is not possible to detect the value as an abnormality.

An object of the present invention is to detect an overcurrent indicating an abnormality of a load even when the power supply voltage applied to the load is low.

Solution to Problem

To solve the above problems, in the in-vehicle electronic control device according to the present invention, by providing a second detection means that detects a load abnormality by calculating the resistance value of the load using information of the power supply voltage applied to the load, in addition to a first detection means that detects an overcurrent state that indicates the load abnormality using only current value information, it is possible to detect an overcurrent indicating an abnormality of the load even when the power supply voltage applied to the load is low.

Further, in the present invention, by providing a means for switching the threshold value for detecting an overcurrent stepwise according to the power supply voltage applied to the load, it is possible to detect an overcurrent indicating an abnormality of the load even when the power supply voltage applied to the load is low.

Advantageous Effects of Invention

According to the present invention, it is possible to detect an overcurrent indicating an abnormality of the load even when the power supply voltage applied to the load is lower than that in the related art by adding a new second detection means to the existing first detection means. When the second detection means is executed by the program of the arithmetic device, it can be realized with the existing circuit configuration.

Further, according to the present invention, since the overcurrent detection is performed by only the existing first detection means when the power supply voltage applied to the load is high, it is possible to reduce the processing burden when the second detection means is executed by the program of the arithmetic device.

Further, according to the present invention, since the threshold value for detecting an overcurrent can be switched stepwise according to the power supply voltage applied to the load, it is possible to reduce the burden on the second detection means when it is realized by a slight change in the existing first detection means or the program of the arithmetic device.

DESCRIPTION OF EMBODIMENTS

Embodiments of the present invention will be described below with reference to the drawings. In addition, each embodiment can be combined.

First Embodiment

Figure 1:
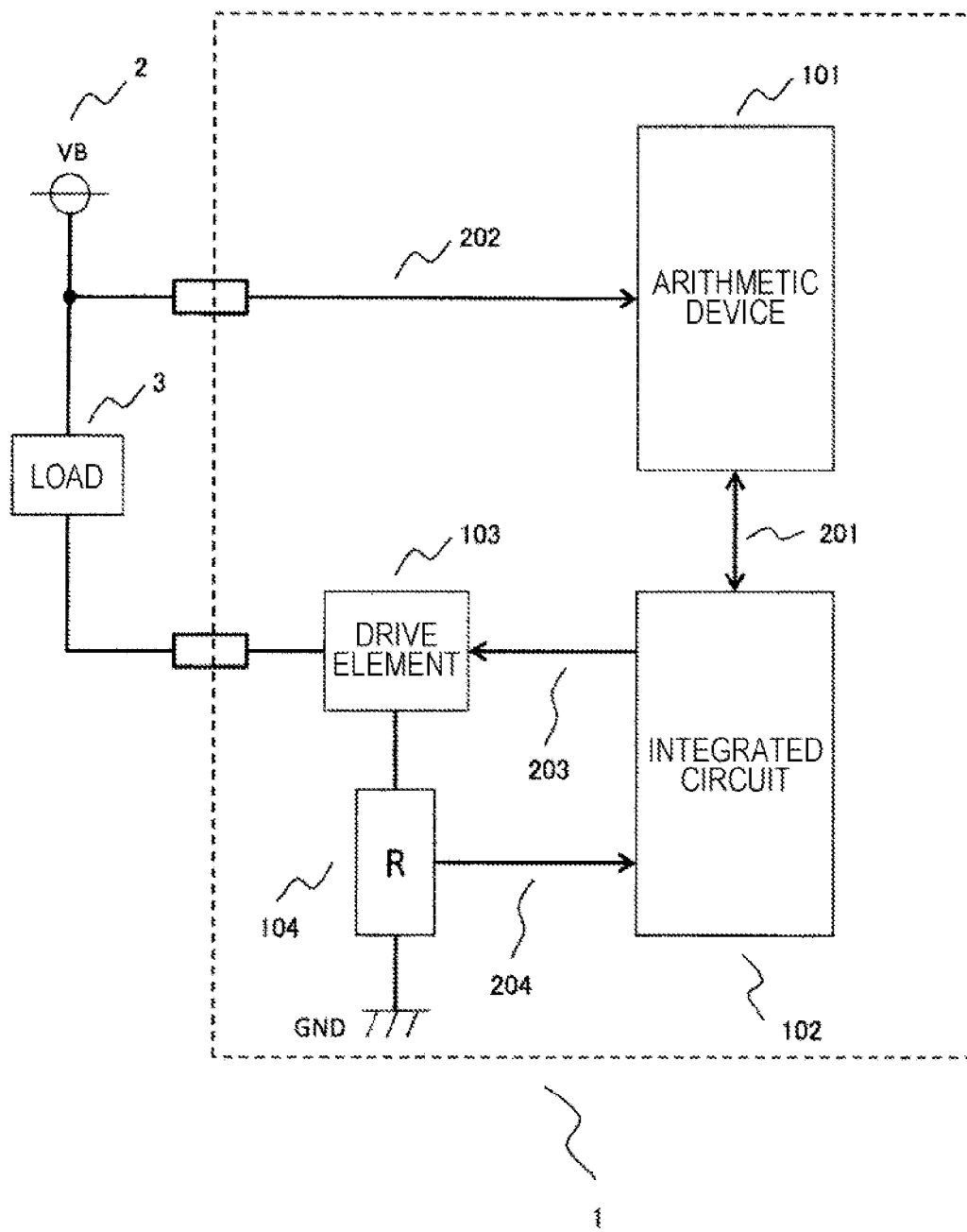
FIG. 1 is a circuit configuration diagram of an in-vehicle electronic control device according to the present invention.

The first embodiment of the present invention will be described with reference to FIGS. 1 and 2.

In order to drive a load 3, a battery 2 as a load power supply is connected to the load 3.

An ECU 1 includes a drive element 103 that drives the load 3, a current detection resistor 104 that detects the current flowing through the load 3, an integrated circuit 102, and an arithmetic device 101.

The drive element 103 drives the load 3 by a control signal 203 from the integrated circuit 102.

The current detection resistor 104 acquires a voltage value proportional to the current flowing through the load 3. The acquired voltage value is input to the integrated circuit 102 as load current value information 204.

The arithmetic device 101 performs an operation that drives the load 3 by using an input signal such as that from a sensor connected to the ECU 1. The integrated circuit 102 outputs the control signal 203 to the drive element 103 in response to a control command from the arithmetic device 101. The integrated circuit 102 includes a first diagnostic unit that diagnoses an overcurrent when the load current value information 204 exceeds the current threshold value. This detection method is a conventionally known method, and is used here as the first detection means. Further, the current threshold value is generally set as a fixed value.

The current threshold value of the integrated circuit 102 is set as a fixed value as described above, but there is a range of possible values due to individual differences due to manufacturing variations and environmental factors such as temperature.

Figure 2:
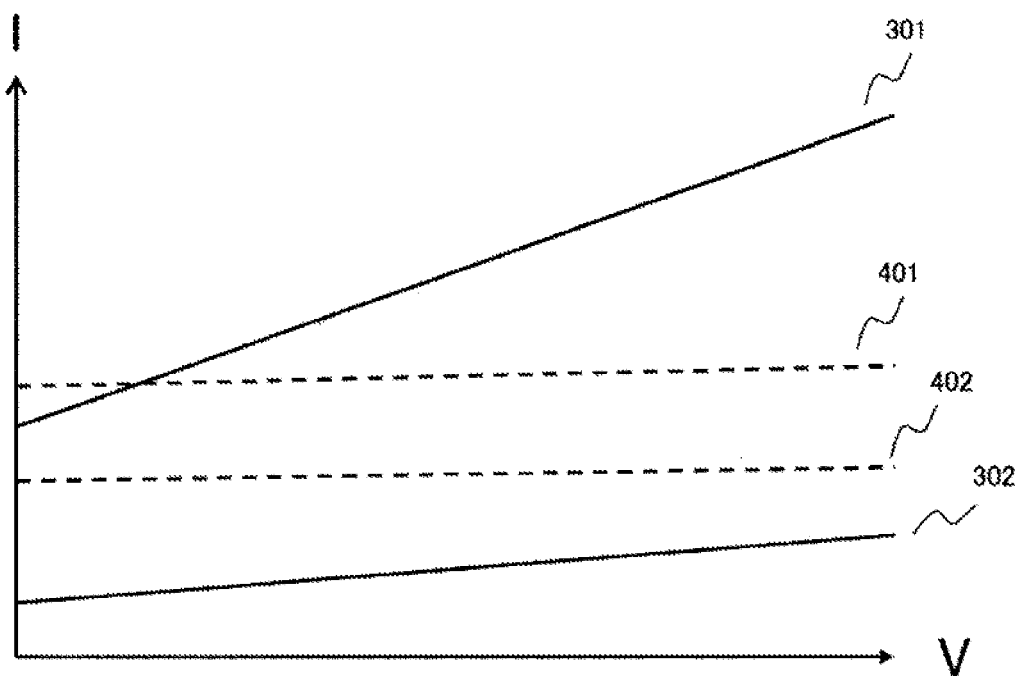
FIG. 2 is a current threshold value in a first embodiment of the present invention.

As shown in FIG. 2, there are an individual having a maximum current threshold value 401 and an individual having a minimum current threshold value 402.

In the related art, the overcurrent diagnosis has been performed at a voltage value where a current value 301 exceeds the maximum current threshold value 401. In recent years, there has been an increasing demand for the overcurrent diagnosis at low voltage, and the overcurrent diagnosis at a voltage where the current value 301 is lower than the maximum current threshold value 401 is required. In this case, as shown in FIG. 2, a new problem that the overcurrent diagnosis can be performed for an individual whose current threshold value is the minimum current threshold value 402, but the overcurrent diagnosis cannot be performed for an individual whose current threshold value is the maximum current threshold value 401 has been found.

Therefore, in the embodiment, in order to detect the load abnormality, the second detection means is implemented in addition to the first detection means.

Next, the second detection means will be described.

The arithmetic device 101 communicates with the integrated circuit 102 through a communication line 201, and acquires current value information 204, flowing through the load 3, input to the integrated circuit 102. The power supply voltage applied to the load 3 is input to the arithmetic device 101 via an analog-to-digital converter (not shown) as load power supply voltage value information 202.

When the arithmetic device 101 determines that the power supply voltage applied to the load is low based on the load power supply voltage value information 202 applied to the load 3, a second detection means that detects a load abnormality is performed by calculating the resistance value of the load from the current value information 204 flowing through the load 3 and the load power supply voltage value information 202 applied to the load 3.

The resistance value of the load is simply acquired by dividing the load power supply voltage value information 202 by the current value information 204. To be precise, it is acquired by subtracting the resistance value of the connection cable of the load and the ECU, the wiring in the ECU, the resistance value of the drive element, etc. from the resistance value acquired simply.

For example, suppose that when the normal load is 10 ohms and does not fall below 9 ohms even when the initial variation and temperature characteristics are taken into consideration, the result of 2 ohms or less is reliably detected as a load abnormality. Considering the error of the load power supply voltage value information 202 and the current value information 204, it can be realized by incorporating, in the arithmetic device 101, a process of determining that the load is abnormal when the calculation result by the arithmetic device 101 is 3 ohms or less.

In the case of this example, when the resistance value at which it is determined that the load is abnormal is set to a value close to 9 ohms, it is easier to catch an abnormal sign before a complete battery short, and there is a possibility that load deterioration can be detected at an early stage.

On the contrary, when the resistance value is set to a value close to 2 ohms, it is easy to detect only when a truly abnormal state occurs, and the possibility of a false notification in which the result is detected as abnormal even though the load is normal can be reduced.

When the resistance threshold value is set to an intermediate value that is a compromise between the two, it is possible to catch an abnormal sign while reducing a false notification.

In the embodiment, the current detection resistor 104 is used as a current detection means for acquiring the current value information 204. It is also possible to detect the current by building the drive element 103 into the integrated circuit 102, and configuring a current mirror circuit.

Further, in the embodiment, while the communication line 201 with the integrated circuit 102 is used as a means for the arithmetic device 101 to acquire the current value information 204, for example, it is also possible for the integrated circuit 102 to output the current value information 204 as amplified voltage information, and for the arithmetic device 101 to capture the information using an analog-to-digital converter.

The arithmetic device 101 is generally composed of a microcomputer, but can also be realized by an FPGA, a DSP, an ASIC, or the like.

Further, in the embodiment, while a low-side circuit is used in which the load 3 is connected to the power supply, and the drive element 103 sucks a current, the same effect can be acquired in a high-side circuit in which the load 3 is grounded, and the drive element 103 discharges a current.

In the embodiment, at a voltage when the current at the time of load resistance abnormality exceeds the maximum threshold value current value, only the first detection means that detects an abnormality in the integrated circuit based on the load current is used. In the embodiment, at a voltage, when the current at the time of load resistance abnormality is equal to or less than the maximum threshold value current value, in which abnormality may not be detected by the first detection means, both the second detection means that detects an abnormality by the resistance value acquired by the arithmetic device 101 based on the load power supply voltage information and the current value information input to the arithmetic device 101, and the adopt first detection means are used to determine that the load is abnormal when either one is determined to be abnormal. According to the embodiment, since the load abnormality detection is performed without using the arithmetic device 101 in the area where the integrated circuit 102 can detect the abnormality, the arithmetic load of the arithmetic device 101 can be reduced, and in the low voltage region where load abnormalities cannot be detected by the integrated circuit 102 alone, the load resistance is calculated by the arithmetic device 101 to detect the load abnormality, so that it is possible to detect the load abnormality even in the low voltage region. After detecting the abnormality, the ECU 1 notifies the outside of the ECU 1 of the occurrence of the abnormality with a warning light or an alarm sound to perform a process such as stopping the driving of the load 3.

Second Embodiment

Hereinafter, the second embodiment of the present invention will be described with reference to FIG. 3. The description of the same configuration as the first embodiment will be omitted.

As described in the first embodiment, the first detection means has a maximum current threshold value 401 and a minimum current threshold value 402 shown in FIG. 2. In the first embodiment, these two values are constant values (fixed values) regardless of the power supply voltage V applied to the load 3. On the other hand, in the embodiment, as shown in FIG. 3, it has a maximum current threshold value 501 and a minimum current threshold value 502 that are proportional to the power supply voltage V applied to the load 3.

Here, since the minimum current threshold value 502 is set to a value larger than a current value 302 that can be taken when the load resistance is normal, and changes in the same manner as the current value 302 at the time of normality in proportion to the power supply voltage V applied to the load 3, it is not detected as an overcurrent.

Further, since the maximum current threshold value 501 is set to a value smaller than the current value 301 that can be taken when the load resistance is abnormal, and changes in the same way as the current value 301 at the time of abnormality in proportion to the power supply voltage V applied to the load 3, it can be detected as an overcurrent.

The maximum current threshold value 501 and the minimum current threshold value 502 can be defined as resistance values. As described in the first embodiment, it is simply acquired by dividing the load power supply voltage value information 202 by the current value information 204. Using a microcomputer, it is possible to perform calculation in real time and diagnose whether the load 3 is abnormal or normal.

Third Embodiment

Hereinafter, the third embodiment will be described with reference to FIG. 4.

Figure 3:
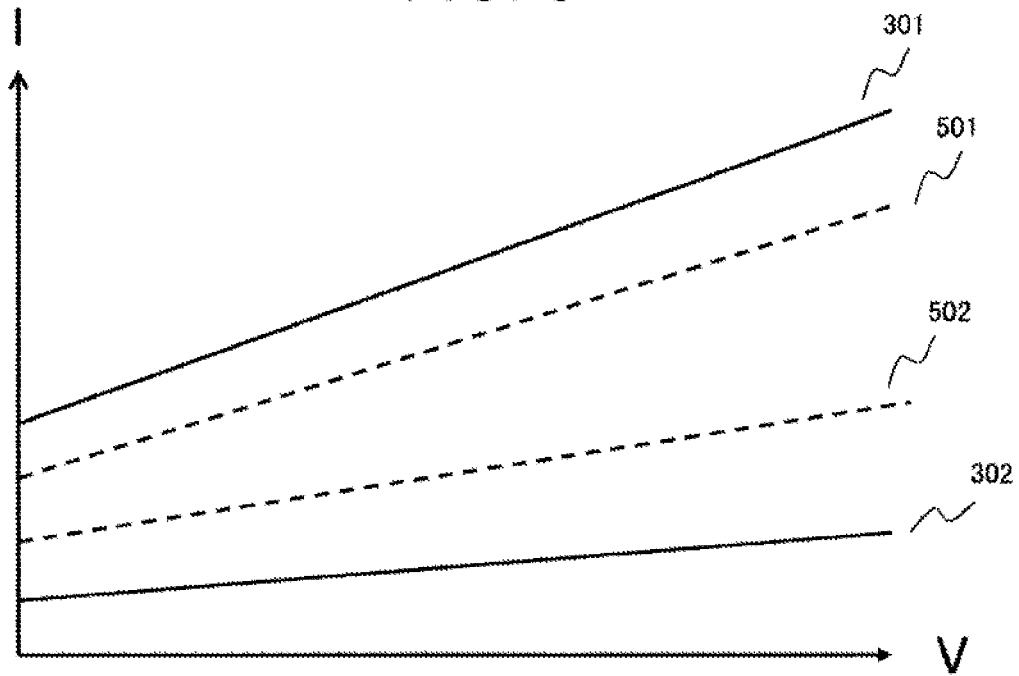
FIG. 3 is a current threshold value (straight line) in a second embodiment of the present invention.
Figure 4:
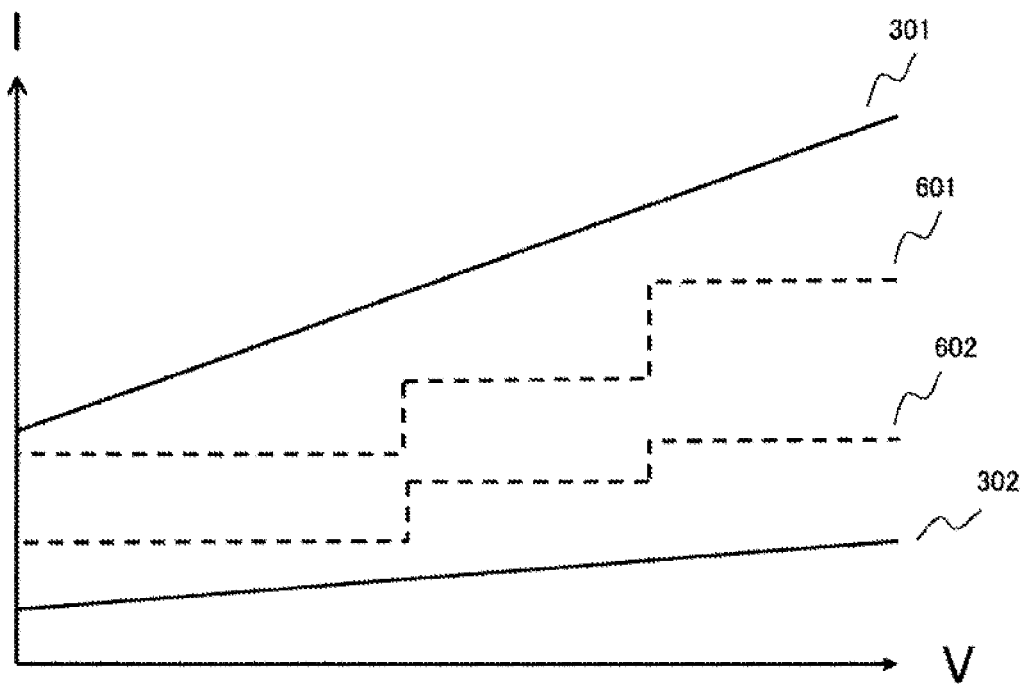
FIG. 4 is a current threshold value (3 steps) in a third embodiment of the present invention.

FIG. 4 shows a simplification of the setting of the maximum current threshold value 501 and the minimum current threshold value 502 shown in FIG. 3. A maximum current threshold value 601 and a minimum current threshold value 602 shown here have three steps of values with respect to the power supply voltage V applied to the load 3.

The maximum current threshold value 601 and the minimum current threshold value 602 do not need to be calculated in real time by the load power supply voltage value information 202 and the current value information 204, but may be set in advance as three current threshold values for the load power supply voltage value information 202. In a case of realizing by a microcomputer, the processing load due to the calculation is not increased, and it can be achieved by inputting the load power supply voltage information 202 to the integrated circuit 102 and increasing the number of current threshold values from one to three.

In the embodiment, while the power supply voltage V applied to the load 3 has a three-step threshold value, it doesn't need to have the three-step threshold value. In some cases, two steps are enough, or on the contrary, it is possible to support a wide range of power supply voltages by setting the number of steps to 4 or more.

REFERENCE SIGNS LIST

1 in-vehicle electronic control device
2 battery
3 load
101 arithmetic device
102 integrated circuit
103 drive element
104 current detection resistor
201 arithmetic device-integrated circuit communication line
202 load power supply voltage value information
203 drive element control signal line
204 load current value information
301 voltage-current straight line when load resistance is abnormal
302 voltage-current straight line when load resistance is normal
401 maximum current threshold value of first embodiment
402 minimum current threshold value of first embodiment
501 maximum current threshold value of second embodiment (straight line)
502 minimum current threshold value of second embodiment (straight line)
601 maximum current threshold value of second embodiment (3 steps)
602 minimum current threshold value of second embodiment (3 steps)

The invention claimed is:
1. An in-vehicle electronic control device comprising:
a drive element that drives an external element;
a current detection unit that detects a current value flowing through the external element; and
a control unit that uses information of the current value to transmit a control command to the drive element, wherein
the in-vehicle electronic control device includes a first detection means that detects an abnormality of the external element when current value information acquired from the current detection unit is equal to or higher than a threshold value of a current of the external element, a second detection means that detects an abnormality when a resistance value of the external element is calculated using the current value information and information of a power supply voltage applied to the external element, and the calculated resistance value is equal to or less than a threshold value of a resistance of the external element, the in-vehicle electronic control device includes an integrated circuit including the control unit, and an arithmetic device that acquires the current value information from the integrated circuit, the integrated circuit executes the first detection means, the arithmetic device executes the second detection means, when a voltage applied to the external element exceeds a predetermined voltage, the first detection means is performed, and the second detection means is not executed, and when a voltage applied to the external element is equal to or less than the predetermined voltage, at least the second detection means is performed.

2. The in-vehicle electronic control device according to claim 1, wherein when a voltage applied to the external element is equal to or less than the predetermined voltage, both the first detection means and the second detection means are performed, and when any of the first detection means and the second detection means detects an abnormality, the external element is determined to be abnormal.

3. The in-vehicle electronic control device according to claim 1, wherein the predetermined voltage is equal to or higher than a voltage at which a current value when the external element is abnormal intersects a maximum threshold value of a current for determining an abnormality of the external element.

4. An in-vehicle electronic control device comprising:
a drive element that drives an external element;
a current detection unit that detects a current value flowing through the external element; and
a control unit that uses information of the current value to transmit a control command to the drive element, wherein the in-vehicle electronic control device includes a first detection means that detects an abnormality of the external element when current value information acquired from the current detection unit is equal to or higher than a threshold value of a current of the external element, and a second detection means that detects an abnormality when a resistance value of the external element is calculated using the current value information and information of a power supply voltage applied to the external element, and the calculated resistance value is equal to or less than a threshold value of a resistance of the external element, a relationship in which a threshold value current is proportional to a voltage is provided so that the first detection means sets a threshold value of a current for determining an abnormality of the external element to low when a power supply voltage applied to the external element is low, and sets a threshold value of a current for determining an abnormality of the external element to high when the power supply voltage applied to the external element is high, the in-vehicle electronic control device includes an integrated circuit including the control unit, and an arithmetic device that acquires the current value information from the integrated circuit, the integrated circuit executes the first detection means, the arithmetic device executes the second detection means, when a voltage applied to the external element exceeds a predetermined voltage, the first detection means is performed, and the second detection means is not executed, and when a voltage applied to the external element is equal to or less than the predetermined voltage, at least the second detection means is performed.

5. An in-vehicle electronic control device comprising:
a drive element that drives an external element;
a current detection unit that detects a current value flowing through the external element; and
a control unit that uses information of the current value to transmit a control command to the drive element, wherein the in-vehicle electronic control device includes a first detection means that detects an abnormality of the external element when current value information acquired from the current detection unit is equal to or higher than a threshold value of a current of the external element, and a second detection means that detects an abnormality when a resistance value of the external element is calculated using the current value information and information of a power supply voltage applied to the external element, and the calculated resistance value is equal to or less than a threshold value of a resistance of the external element, the first detection means has a function of switching a threshold value of a current for determining an abnormality of the external element based on information of a power supply voltage applied to the external element, the in-vehicle electronic control device includes an integrated circuit including the control unit, and an arithmetic device that acquires the current value information from the integrated circuit, the integrated circuit executes the first detection means, the arithmetic device executes the second detection means, when a voltage applied to the external element exceeds a predetermined voltage, the first detection means is performed, and the second detection means is not executed, and when a voltage applied to the external element is equal to or less than the predetermined voltage, at least the second detection means is performed.

* * * * *